US012230953B2

(12) United States Patent
Zhang et al.

(10) Patent No.: US 12,230,953 B2
(45) Date of Patent: Feb. 18, 2025

(54) ARC FAULT DETECTION USING MACHINE LEARNING

(71) Applicant: Leviton Manufacturing Co., Inc., Melville, NY (US)

(72) Inventors: Yazhou Zhang, Manhasset, NY (US); Michael Ostrovsky, Brooklyn, NY (US); Ankit Sanghvi, Hicksville, NY (US); Adam Kevelos, Plainview, NY (US)

(73) Assignee: Leviton Manufacturing Co., Inc., Melville, NY (US)

( * ) Notice: Subject to any disclaimer, the term of this patent is extended or adjusted under 35 U.S.C. 154(b) by 184 days.

(21) Appl. No.: 17/778,524

(22) PCT Filed: May 18, 2022

(86) PCT No.: PCT/US2022/029764
§ 371 (c)(1),
(2) Date: Aug. 25, 2022

(87) PCT Pub. No.: WO2022/265794
PCT Pub. Date: Dec. 22, 2022

(65) Prior Publication Data
US 2023/0053431 A1 Feb. 23, 2023

(51) Int. Cl.
*H02H 1/00* (2006.01)
*G06N 5/01* (2023.01)
(Continued)

(52) U.S. Cl.
CPC ............. *H02H 1/0015* (2013.01); *G06N 5/01* (2023.01); *G06N 20/00* (2019.01); *H02H 3/46* (2013.01)

(58) Field of Classification Search
CPC .......... G06N 20/00; G06N 5/01; G01R 31/12; G01R 31/3333; H02H 1/0092;
(Continued)

(56) References Cited

U.S. PATENT DOCUMENTS

| 5,854,590 A | 12/1998 | Dalstein |
| 7,826,184 B2 | 11/2010 | Rivers et al. |

(Continued)

FOREIGN PATENT DOCUMENTS

| BR | 112014003437 A2 | 3/2017 |
| CA | 2842994 A1 | 2/2013 |

(Continued)

OTHER PUBLICATIONS

International Search Report and Written Opinion of the International Searching Authority issued in corresponding application PCT/US22/29764 mailed Aug. 25, 2022 (18 pages).

*Primary Examiner* — Kevin J Comber
(74) *Attorney, Agent, or Firm* — Carter, DeLuca & Farrell LLP; George Likourezos; David C. Lee

(57) ABSTRACT

In aspects of the present disclosure, a circuit interrupter includes a housing, a conductive path, a switch which selectively interrupts the conductive path, sensor(s), memory, and a controller within the housing. The sensor(s) measure electrical characteristic(s) of the conductive path. The memory stores an arc detection program that implements a machine learning model and includes a field-updatable program portion and a non-field-updatable program portion, where the field-updatable program portion includes program parameters used by the non-field-updatable program portion to decide between presence or absence of an arc fault. The controller executes the arc detection program to compute input data for the machine learning model based on the sensor measurements, decide between presence of an arc event or absence of an arc event based on (Continued)

the input data, and cause the switch to interrupt the conductive path when the decision indicates presence of an arc event.

21 Claims, 9 Drawing Sheets

(51) Int. Cl.
    *G06N 20/00*         (2019.01)
    *H02H 3/46*         (2006.01)

(58) Field of Classification Search
    CPC .......... H02H 1/0015; H02H 3/45; H02H 3/52; H02H 3/33
    USPC .......................................................... 361/42
    See application file for complete search history.

(56) References Cited

U.S. PATENT DOCUMENTS

| | | | |
|---|---|---|---|
| 8,576,521 | B2 | 11/2013 | Rodgers et al. |
| 10,367,347 | B2 | 7/2019 | Ostrovsky et al. |
| 10,790,779 | B2 | 9/2020 | Balog, Jr. et al. |
| 10,804,688 | B2 | 10/2020 | Ayeb et al. |
| 2005/0116814 | A1 | 6/2005 | Rodgers et al. |
| 2008/0157781 | A1 | 7/2008 | Mason et al. |
| 2009/0168277 | A1 | 7/2009 | Changali et al. |
| 2013/0044395 | A1 | 2/2013 | Rodgers et al. |
| 2013/0226479 | A1* | 8/2013 | Grosjean ................ G01R 31/52 702/58 |
| 2016/0231721 | A1* | 8/2016 | Lakshmanan .......... H01H 71/00 |
| 2018/0351505 | A1 | 12/2018 | Balog, Jr. et al. |
| 2019/0199081 | A1 | 6/2019 | Ayeb et al. |
| 2020/0365356 | A1 | 11/2020 | Telefus et al. |

FOREIGN PATENT DOCUMENTS

| | | |
|---|---|---|
| CA | 2842994 C | 8/2020 |
| CN | 102279339 A | 12/2011 |
| CN | 101706527 B | 1/2012 |
| CN | 103733457 A | 4/2014 |
| CN | 104569684 A | 4/2015 |
| CN | 103733457 B | 8/2017 |
| CN | 107086855 A | 8/2017 |
| CN | 107340459 A | 11/2017 |
| CN | 108535589 A | 9/2018 |
| CN | 107086855 B | 10/2018 |
| CN | 109298291 A | 2/2019 |
| CN | 109521301 A | 3/2019 |
| CN | 109975673 A | 7/2019 |
| CN | 110007197 A | 7/2019 |
| CN | 110118900 A | 8/2019 |
| CN | 110320452 A | 10/2019 |
| CN | 110456234 A | 11/2019 |
| CN | 110488161 A | 11/2019 |
| CN | 110542835 A | 12/2019 |
| CN | 110568327 A | 12/2019 |
| CN | 110763958 A | 2/2020 |
| CN | 111095712 A | 5/2020 |
| CN | 111123048 A | 5/2020 |
| CN | 111239569 A | 6/2020 |
| CN | 111458599 A | 7/2020 |
| CN | 111707908 A | 9/2020 |
| EP | 2745366 A1 | 6/2014 |
| EP | 3695476 A1 | 8/2020 |
| FR | 2912547 A1 | 8/2008 |
| JP | 2014525725 A | 9/2014 |
| MX | 2014001488 A | 5/2014 |
| MX | 330787 B | 6/2015 |
| WO | 2013025411 A1 | 2/2013 |
| WO | 2019075217 A1 | 4/2019 |

* cited by examiner

ARC FAULT DETECTION USING MACHINE LEARNING

CROSS-REFERENCE TO RELATED APPLICATION

This application is a U.S. National Stage Application filed under 35 U.S.C. § 371 of International Application No. PCT/US2022/029764, filed on May 18, 2022, which claims priority to U.S. Provisional Application No. 63/210,577, filed on Jun. 15, 2021. The entire contents of each of the foregoing applications are hereby incorporated by reference herein.

TECHNICAL FIELD

The present disclosure relates to electrical fault detection and load control/circuit interrupter devices, and more particularly, to arc fault detection and circuit interruption in such devices, including interruption of current in circuit breakers and receptacles.

BACKGROUND

Arc Fault Circuit Interrupter (AFCI) devices are configured to recognize arcing conditions in electrical wiring systems and interrupt current flow to extinguish arcing. At the same time, AFCI systems or devices need to be resistant to nuisance tripping, which may be caused by noise produced by electrical motors, switches, dimmers, and other devices operating normally.

There are generally two types of arc faults, series arc faults and parallel arc faults. A series arc fault is in series with the load and thus cannot have a current value that is greater than the load current. Whereas, parallel arc faults may occur between any pairing of phase and neutral conductive paths, phase and ground conductive paths, or neutral and ground conductive paths. In contrast to series arc faults, the current value in parallel arc faults is not limited by the load and as a result, the current in parallel arc faults can potentially be much greater.

In the case of a parallel arc fault to ground, such an arc fault may be cleared either by a typical ground fault circuit interrupter (GFCI) or an AFCI.

Both series and parallel arc faults can serve as a source of ignition of surrounding combustible materials.

The following U.S. patents are hereby incorporated by reference in their entirety: U.S. Pat. No. 10,367,347 which issued on Jul. 30, 2019 to Ostrovsky et al.; U.S. Pat. No. 7,986,148 which issued on Jul. 26, 2011 to Mernyk et al; U.S. Pat. No. 7,535,234 which issued on May 19, 2009 to Mernyk et al; U.S. Pat. No. 7,259,568 which issued on Aug. 21, 2007 to Mernyk et al; U.S. Pat. No. 6,972,572 which issued on Dec. 6, 2005 to Mernyk et al.

SUMMARY

The present disclosure relates to electrical fault detection and load control/interrupter devices in, for example, wall box receptacles or breakers, and to arc fault detection and circuit interruption in such devices. Aspects of the present disclosure relate to detecting arc faults using a trained machine learning model and using input data, for the machine learning model, which are computed based on sensor measurements of electrical characteristics (e.g., voltage, current, low/high frequency signals, and the like) of a conductive path in such devices. Aspects of the present disclosure provide an arc detection program which implements the trained machine learning model in a manner such that only machine learning parameters need to be updated during firmware updates. The firmware updates can provide updated machine learning parameters which are trained based on data gathered from installed AFCI devices in the field and which reduce false positive arc event decisions.

In accordance with aspects of the present disclosure, a circuit interrupter includes a housing configured to be installed in at least one of an electrical wall box or a load center, a conductive path, a switch configured to selectively interrupt the conductive path, at least one sensor in electrical communication with the conductive path and configured to measure at least one electrical characteristic of the conductive path to provide a plurality of sensor measurements, a memory, and a controller. The memory is configured to store an arc detection program which implements a machine learning model and includes a field-updatable program portion configured to be field-updatable and a non-field-updatable program portion. The field-updatable program portion includes a plurality of program parameters to be used by the non-field-updatable program portion for deciding between presence of an arc event or absence of an arc event. The controller is positioned within the housing and is coupled to the memory. The arc detection program, when executed by the controller, causes the controller to perform an operation that includes computing input data for the machine learning model based on the plurality of sensor measurements, deciding between presence of an arc event or absence of an arc event, based on the input data, to provide a decision, and causing the switch to interrupt the conductive path when the decision indicates presence of an arc event.

In various embodiments of the circuit interrupter, the circuit interrupter includes a communication device, and the controller is further configured to cause the communication device to communicate, with a remote device, at least one of: the plurality of sensor measurements or the input data computed based on the plurality of sensor measurements.

In various embodiments of the circuit interrupter, the circuit interrupter includes a user-accessible actuator, and the controller is configured to cause the communication device to communicate with the remote device when the user-accessible actuator is actuated.

In various embodiments of the circuit interrupter, the memory is configured to store a firmware update program which, when executed by the controller, causes the controller to perform a further operation that includes causing the communication device to receive an updated program portion having reduced false positive arc event decisions, and replacing the field-updatable program portion of the arc detection program with the updated program portion.

In various embodiments of the circuit interrupter, the arc detection program implements a machine learning model having nodes, the plurality of program parameters of the field-updatable program portion are node parameters of the nodes of the machine learning model, and the non-field-updatable program portion is configured to perform node operations for the nodes of the machine learning model.

In various embodiments of the circuit interrupter, the machine learning model is a decision tree. The node parameters include, for each node of the decision tree, one of: a branch criterion and destination nodes, or a decision tree decision. The node operations include, for each node of the decision tree: deciding whether the node parameters for the node include a decision tree decision or a branch criterion; in the case the node parameters for the node include of a decision tree decision, providing the decision tree decision;

and in the case the node parameters for the node include a branch criterion and destination nodes, apply the branch criterion to the input data to select one of the destination nodes, and repeat the node operations for the selected destination node.

In various embodiments of the circuit interrupter, the plurality of sensor measurements include high frequency component measurements relating to a high frequency characteristic of the conductive path, and the input data includes high frequency component input data computed based on the high frequency component measurements. The high frequency component input data includes at least one of: (i) a close to low count computed as: a number of the high frequency component measurements in a first low measurement range when an average of the high frequency component measurements is in a first range, or a number of the high frequency component measurements in a second low measurement range when the average of the high frequency component measurements is in a second range; (ii) a close to high count computed as: a number of the high frequency component measurements in a first high measurement range when the average of the high frequency component measurements is in the first range, or a number of the high frequency component measurements in a second high measurement range when the average of the high frequency component measurements is in the second range; (iii) an index difference between a first index corresponding to a maximum increase between consecutive measurements of the high frequency component measurements and a second index corresponding to a maximum decrease between consecutive measurements of the high frequency component measurements; (iv) a low count computed as a number of the high frequency component measurements in a third low measurement range, wherein the third low measurement range is below the second range; (v) a first high count computed as a number of the high frequency component measurements in a third high measurement range; or (vi) a second high count computed as a number of the high frequency component samples in a fourth high measurement range.

In accordance with aspects of the present disclosure, a method in a circuit interrupter is disclosed, where the circuit interrupted includes a conductive path, a switch configured to selectively interrupt the conductive path, and at least one sensor in electrical communication with the conductive path and configured to measure at least one electrical characteristic of the conductive path to provide a plurality of sensor measurements. The method includes executing an arc detection program in the circuit interrupter, where the arc detection program implements a machine learning model and includes a field-updatable program portion configured to be field-updatable and a non-field-updatable program portion. The field-updatable program portion includes a plurality of program parameters to be used by the non-field-updatable program portion for deciding between presence of an arc event or absence of an arc event. Executing the arc detection program causes the circuit interrupter to perform an operation that includes computing input data for the machine learning model based on the plurality of sensor measurements, deciding between presence of an arc event or absence of an arc event, based on the input data, to provide a decision, and causing the switch to interrupt the conductive path when the decision indicates presence of an arc event.

In various embodiments of the method, the method includes communicating, with a remote device, at least one of: the plurality of sensor measurements or the input data computed based on the plurality of sensor measurements.

In various embodiments of the method, the method includes receiving an updated program portion having reduced false positive arc event decisions, and replacing the field-updatable program portion of the arc detection program with the updated program portion.

In various embodiments of the method, the arc detection program implements a machine learning model having nodes, the plurality of program parameters of the field-updatable program portion are node parameters of the nodes of the machine learning model, and the non-field-updatable program portion is configured to perform node operations for the nodes of the machine learning model.

In various embodiments of the method, the machine learning model is a decision tree. The node parameters include, for each node of the decision tree, one of: a branch criterion and destination nodes, or a decision tree decision. The node operations include, for each node of the decision tree: deciding whether the node parameters for the node include a decision tree decision or a branch criterion; in the case the node parameters for the node include of a decision tree decision, providing the decision tree decision; and in the case the node parameters for the node include a branch criterion and destination nodes, apply the branch criterion to the input data to select one of the destination nodes, and repeat the node operations for the selected destination node.

In various embodiments of the method, the plurality of sensor measurements include high frequency component measurements relating to a high frequency characteristic of the conductive path, and the input data includes high frequency component input data computed based on the high frequency component measurements. The high frequency component input data include at least one of: (i) a close to low count computed as: a number of the high frequency component measurements in a first low measurement range when an average of the high frequency component measurements is in a first range, or a number of the high frequency component measurements in a second low measurement range when the average of the high frequency component measurements is in a second range; (ii) a close to high count computed as: a number of the high frequency component measurements in a first high measurement range when the average of the high frequency component measurements is in the first range, or a number of the high frequency component measurements in a second high measurement range when the average of the high frequency component measurements is in the second range; (iii) an index difference between a first index corresponding to a maximum increase between consecutive measurements of the high frequency component measurements and a second index corresponding to a maximum decrease between consecutive measurements of the high frequency component measurements; (iv) a low count computed as a number of the high frequency component measurements in a third low measurement range, wherein the third low measurement range is below the second range; (v) a first high count computed as a number of the high frequency component measurements in a third high measurement range; or (vi) a second high count computed as a number of the high frequency component samples in a fourth high measurement range.

In accordance with aspects of the present disclosure, a processor-implemented method is disclosed for updating installed arc fault circuit interrupt (AFCI) devices configured to execute an arc detection program implementing a machine learning model. The arc detection program includes a field-updatable program portion configured to be field-updatable and a non-field-updatable program portion. The field-updatable program portion includes a plurality of program parameters to be used by the non-field-updatable program portion for deciding between presence of an arc event or absence of an arc event. The processor-implemented method includes: receiving, from the installed AFCI devices, event data including at least one of: (i) a plurality of sensor measurements provided by sensors, in the installed AFCI devices, configured to measure at least one electrical characteristic of conductive paths in the AFCI devices, or (ii) input data for the machine learning model computed, in the installed AFCI devices, based on the plurality of sensor measurements; preparing, based on the event data, an updated program portion having reduced false positive arc event decisions; and communicating, to the installed AFCI devices, the updated program portion as a replacement for the field-updatable program portion of the arc detection program.

In various embodiments of the processor-implemented method, preparing the updated program portion having reduced false positive arc event decisions includes: in case the event data is the plurality of sensor measurements, computing the input data for the machine learning model based on the plurality of sensor measurements; associating the input data with a label indicating absence of an arc event; training an updated machine learning model using the input data and the label; and providing parameters of the updated machine learning model as the updated program portion.

In various embodiments of the processor-implemented method, the arc detection program implements a machine learning model having nodes, the plurality of program parameters of the field-updatable program portion are node parameters of the nodes of the machine learning model, and the non-field-updatable program portion is configured to perform node operations for the nodes of the machine learning model.

In various embodiments of the processor-implemented method, the machine learning model is a decision tree. The node parameters include, for each node of the decision tree, one of: a branch criterion and destination nodes, or a decision tree decision. The node operations include, for each node of the decision tree: deciding whether the node parameters for the node include a decision tree decision or a branch criterion; in the case the node parameters for the node include of a decision tree decision, providing the decision tree decision; and in the case the node parameters for the node include a branch criterion and destination nodes, apply the branch criterion to the input data to select one of the destination nodes, and repeat the node operations for the selected destination node.

In accordance with aspects of the present disclosure, a system is disclosed for updating installed arc fault circuit interrupt (AFCI) devices which are configured to execute an arc detection program implementing a machine learning model. The arc detection program includes a field-updatable program portion configured to be field-updatable and a non-field-updatable program portion. The field-updatable program portion includes a plurality of program parameters to be used by the non-field-updatable program portion for deciding between presence of an arc event or absence of an arc event. The system includes at least one processor, and one or more memory storing instructions. The instructions, when executed by the at least one processor, cause the system to perform an operation that includes: receiving, from the installed AFCI devices, event data including at least one of: (i) a plurality of sensor measurements provided by sensors, in the installed AFCI devices, configured to measure at least one electrical characteristic of conductive paths in the AFCI devices, or (ii) input data for the machine learning model computed, in the installed AFCI devices, based on the plurality of sensor measurements; preparing, based on the event data, an updated program portion having reduced false positive arc event decisions; and communicating, to the installed AFCI devices, the updated program portion as a replacement for the field-updatable program portion of the arc detection program.

In various embodiments of the system, in preparing the updated program portion having reduced false positive arc event decisions, the instructions, when executed by the at least one processor, cause the system to: in case the event data is the plurality of sensor measurements, compute the input data for the machine learning model based on the plurality of sensor measurements; associate the input data with a label indicating absence of an arc event; train an updated machine learning model using the input data and the label; and provide parameters of the updated machine learning model as the updated program portion.

In various embodiments of the system, the arc detection program implements a machine learning model having nodes, the plurality of program parameters of the field-updatable program portion are node parameters of the nodes of the machine learning model, and the non-field-updatable program portion is configured to perform node operations for the nodes of the machine learning model.

In various embodiments of the system, the machine learning model is a decision tree. The node parameters include, for each node of the decision tree, one of: a branch criterion and destination nodes, or a decision tree decision. The node operations include, for each node of the decision tree: deciding whether the node parameters for the node include a decision tree decision or a branch criterion; in the case the node parameters for the node include of a decision tree decision, providing the decision tree decision; and in the case the node parameters for the node include a branch criterion and destination nodes, apply the branch criterion to the input data to select one of the destination nodes, and repeat the node operations for the selected destination node.

Further details and aspects of exemplary embodiments of the present disclosure are described in more detail below with reference to the appended figures.

DETAILED DESCRIPTION

The present disclosure relates to electrical fault detection and load control/interrupter devices in, for example, wall box receptacles or breakers, and to arc fault detection and circuit interruption in such devices. Aspects of the present disclosure relate to detecting arc faults using a trained machine learning model and using input data, for the machine learning model, which are computed based on sensor measurements of electrical characteristics (e.g., voltage, current, low/high frequency signals, and the like) of a conductive path in such devices. In various embodiments, the electrical fault detection and load control/interrupter devices disclosed herein can be located in an electrical receptacle, in an electrical panel, or in other electrical systems. Aspects of the present disclosure provide an arc detection program which implements the trained machine learning model in a manner such that only machine learning parameters need to be updated during firmware updates. The firmware updates can provide updated machine learning parameters which are trained based on data gathered from installed AFCI devices in the field and which reduce false positive arc event decisions.

Sensors and sensor measurements or samples are be described below herein. Unless indicated otherwise by the context, the terms sensor measurement and sensor sample may be used interchangeably herein, such that occurrences of the term "sample" may be replaced with the term "measurement," and vice versa.

Figure 1:
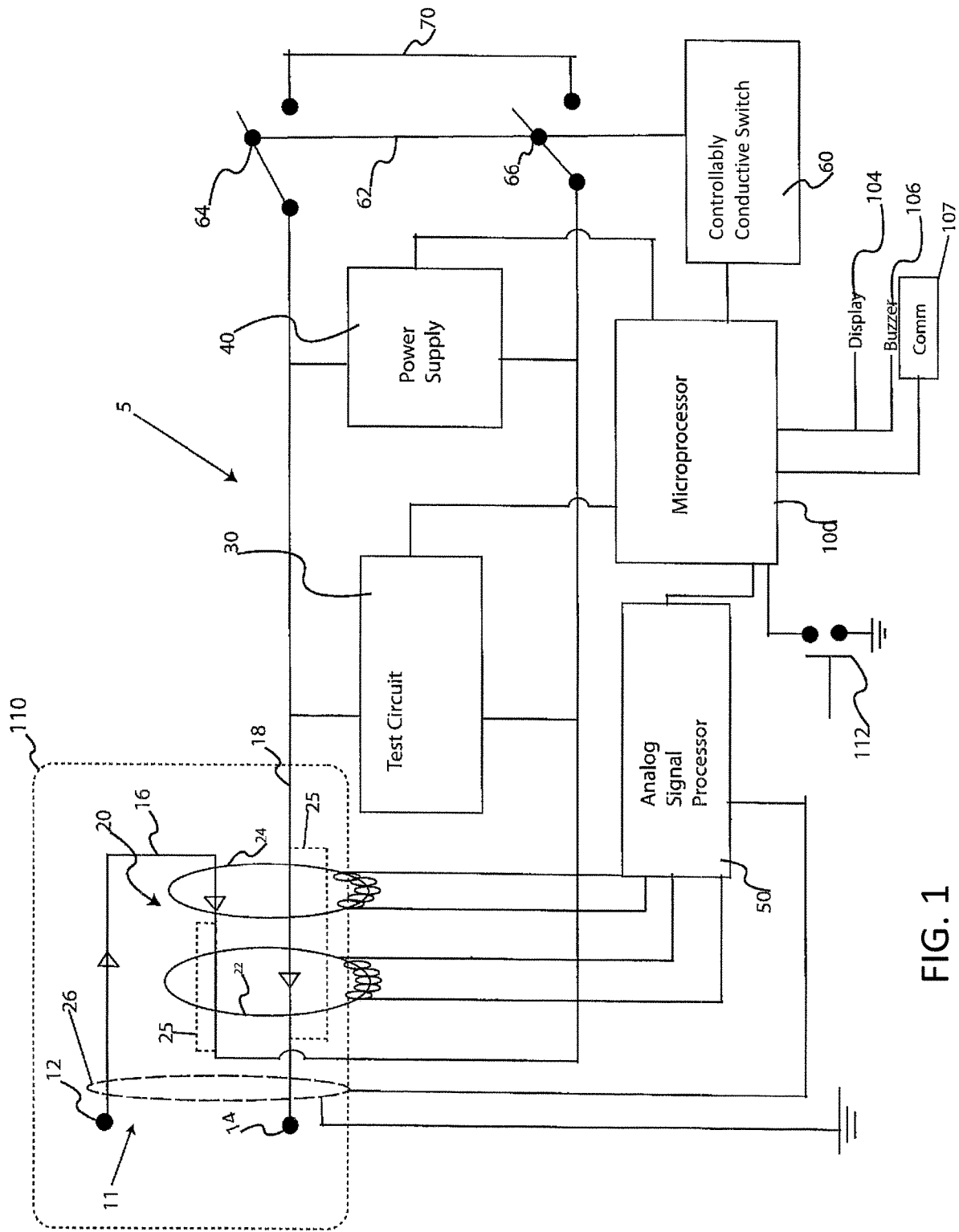
FIG. 1 is a diagram of an exemplary electrical switch apparatus, in accordance with aspects of the present disclosure.

FIG. 1 is a diagram of an exemplary electrical switch apparatus 5. Various embodiments of the electrical switch apparatus 5 include an arc fault circuit interrupter (AFCI) that can be disposed inside of an enclosure such as a single-gang enclosure. For convenience, the following description will refer to the electrical switch apparatus 5 as an AFCI system or device. It will be understood, however, that any description of an AFCI system or device will apply to other types of electrical switch apparatuses as well. The AFCI system 5 may be sized and arranged to be disposed within a housing configured to be installed in a single gang electrical enclosure, such as a wall-box mounted AFCI. In various embodiments, the AFCI system may be housed or mounted in any suitable form factor such as a circuit breaker, a panel mount device, an in-line device, or another housed or mounted form.

As illustrated in FIG. 1, the AFCI device 5 includes line side connections 11 and load side connections 70. Line side connections 11 include a first line contact 12 and a second line contact 14. First line contact 12 is coupled to first conductive path 16 (i.e., a line side phase conductive path), while second line contact 14 is coupled to second conductive path 18 (i.e., a line side neutral conductive path). Contacts 12, 14 can be in the form of terminal screws, wire leads, or other connections that can be coupled to a power line. Load side 70 may be separated from line input conductive paths 11 by separable contacts (e.g., a controllably conductive switch) 62, which include separable contacts 64 and 66. Contact 64 is configured to separate first line side conductive path 16 from a first load side conductive path and contact 66 is configured to separate second line side conductive path 18 from a second load side conductive path.

In the illustrated embodiment shown in FIG. 1, the first conductive path 16 is arranged to conduct current in the same direction as the second conductive path 18 relative to the sensors 22 and 24. It should be readily appreciated by those skilled in the art that when referring to AC current, direction of current flow reverses with a certain frequency/period, e.g., sixty times a second in a standard sixty (60) Hz system. In the description herein, the AC current is described as flowing in a certain direction. When the "direction" of current flow is referred to, it is intended to reflect the "conventional current flow" of the AC circuit as known in the electrical arts.

FIG. 1 shows one embodiment of a wiring layout 110. In various embodiments, another wiring layout may be implemented instead of the wiring layout 110 shown in FIG. 1. It should be readily appreciated by those skilled in the art that any suitable number of conductive paths may be arranged to pass through or near any number of sensors, such as a high frequency sensor 22, a current sensor 24, and/or a differential current sensor 26, which will be described in more detail below. Any of various sensors can be arranged and configured to monitor a single conductive path, e.g., a phase conductive path or a neutral conductive path. In various embodiments, any one of the sensors can be arranged and configured to monitor both the phase and neutral conductive paths.

Any or all of the three sensors 22, 24, 26 can be in electrical communication with one or more conductive paths, such as a phase conductive path or a neutral conductive path. As such, the sensors 22, 24, 26 can be configured to sense and/or measure electrical characteristics of conductive path(s) in communication therewith. As used herein, the term "electrical communication" may include positioning of any of the sensors in a configuration such as adjacent to the device conductive path, electrically coupled to the device conductive path, magnetically coupled to the device conductive path, or positioned such that the device conductive path passes through a core of the sensor, or in another configuration in which a sensor can sense a property of at least a portion of a conductive path. For example, high frequency sensor 22 may be configured to sense/measure high frequency signals, such as high frequency noise. Current sensor 24 may be configured to sense/measure a current value. Differential sensor 26 may be configured to sense/measure a current differential between, for example, the phase and neutral conductive paths. In various embodiments, sensor 22 and sensor 24 may be embodied as a single sensor 20.

High frequency sensor 22 may be any high frequency sensor recognized by persons skilled in the art. In various embodiments, the high frequency sensor 22 may be a transformer having a coil wound around an air core (e.g.—a Rogowski coil) or a high permeability magnetic core (e.g., an iron powder core where powdered iron is encapsulated in an epoxy substrate). In various embodiments, high frequency sensor 22 may be configured with a toroidal core. Other types of high frequency sensors are contemplated to be within the scope of the present disclosure.

Current sensor 24 can be in the form of any low frequency sensor recognized by persons skilled in the art such as a current transformer. In various embodiments, a shunt 25 may be employed, such as a known resistance which allows the current flowing to be determined by measuring the voltage across the shunt.

In various embodiments, each sensor may be configured to detect signals in a predetermined frequency range. For example, the current 24 may be configured to detect electrical characteristics of a current path at a predetermined frequency range of, for example, a power line frequency range or, in various embodiments, a larger frequency range such as 0-2 MHz or 0-4 MHz The high frequency sensor 22 can be configured to detect electrical characteristics of a current path at a predetermined frequency range higher than the low frequency sensor, such as greater than a power line frequency range or, for example, 1-10 MHz, 2-10 MHz, or 4-10 MHz The sensitivity level and frequency range for high frequency sensor 22 may be governed/set by signal processing circuitry. Other frequency ranges are contemplated to be within the scope of the present disclosure.

In various embodiments, an optional differential sensor 26 can also be included in addition to the high frequency sensor 22 and current sensor 24 and can measure the differential current between the conductive paths. Aspects of the optional differential sensor 26 are described in U.S. Pat. No. 10,367,347, which was incorporated by reference above. In the illustrated embodiment, differential sensor 26 is shown in dashed lines to indicate that it may be optionally used or not used in certain embodiments. While sensors 20, 22, 24 and 26 are illustrated in the drawings, some or all of the sensors may not be present in various embodiments of the present disclosure.

In FIG. 1, the outputs of sensors 22, 24, and 26 are connected to circuit 50. Circuit 50 may be any suitable circuit such as, but not limited to, an analog signal processor (ASP). The analog signal processor circuit 50 can include any suitable circuit elements such as, but not limited to, amplifiers, rectifiers, comparators (or a combination thereof), or other elements that condition the signal from one or more of sensors 22, 24, and 26 for input into processor 100. In various embodiments, the analog signal processor circuit 50 may sample the outputs of the sensors 22, 24, and 26. In various embodiments, one or more of the output signals from sensors 22, 24, or 26 may be provided directly to microprocessor 100 without any analog conditioning.

Microprocessor 100 can be any suitable type of processor or controller such as a central processing unit (CPU), graphics processing unit (GPU), digital signal processor (DSP), microcontroller, application specific integrated circuit (ASIC), field-programmable gate array (FPGA), or another type of processor or controller which can perform computations. Microprocessor 100 is configured or programmed to analyze output signals provided by one or more of sensors 22, 24, or 26 and determine if a predetermined condition exists, such as an arc fault. If microprocessor 100 detects a predetermined condition, the microprocessor 100 may be configured or programmed to trigger a controllably conductive switch 60 to electrically isolate one or more of the phase and neutral conductive paths, thus disconnecting power to load 70. The AFCI system includes a power supply 40 which is configured to provide power to the components of the circuit, including the microprocessor 100.

In accordance with aspects of the present disclosure, the microprocessor 100 can implement a trained machine learning model and can compute input data for the machine learning model based on the signals output from the various sensors, such as the high frequency sensor 22 and/or the current sensor 24, among other sensors. The trained machine learning model will be described in more detail later herein. For now, it is sufficient to note that the machine learning model provides a decision about whether or not there has been an arc fault. If the machine learning model decides there has been an arc fault, the microprocessor 100 can trigger the controllably conductive switch 60 to interrupt power to one or more of the phase and neutral conductive paths, thereby disconnecting power to load 70.

The microprocessor 100 can be coupled to one or more indicators 104, 106, communication circuitry 107, and a test circuit 30. A visual indicator 104 and/or an audio indicator 106 can be provided. The indicators 104 and 106 can be any suitable type of indicators such as a LED, light, neon, buzzer, or piezoelectric element. The microprocessor 100 may be configured or programmed to energize test circuit 30 to initiate a test sequence on the device. Aspects of the test functionality are described in U.S. Pat. No. 10,367,347, which was incorporated by referenced above.

The communication circuitry 107 can include a transceiver that enables communication with other devices. In various embodiments, the communication circuitry 107 may enable Wi-Fi communications and/or Bluetooth communications, or another type of communications (e.g., wired or wireless). In various embodiments, communication circuitry 107 can communicate any suitable data to any suitable device or receive data from any suitable device. In accordance with aspects of the present disclosure, the communication circuitry 107 can communicate arc fault information to a remote device/system by communicating, to the remote device/system, data which caused the controllably conductive switch 60 to be triggered. For example, the trained machine learning model mentioned above decides whether an arc fault has occurred based on input data computed by the microprocessor 100. When the microprocessor 100 decides that an arc fault has occurred, the communication circuitry 107 can communicate the input data to the remote device/system for further processing. In various embodiments, the communication circuitry 107 can also communicate a version of the trained machine learning model to the remote system to identify the model which triggered the controllably conductive switch 60. The remote device/system may be any device or system that is not a physical part of the AFCI device 5. A remote device/system may include, for example, a cloud computing system, a propriety computing system, a desktop computer, a laptop, a tablet, a smartphone, and/other another type of device or system that is not a physical part of an AFCI device.

It should be understood by a person of ordinary skill in the art that the individual blocks represented in FIG. 1 may or may not represent individual components. Rather, any suitable combination of the illustrated blocks may be implemented by a single component such as, but not limited to, a microprocessor, integrated circuit, or the like. Similarly, any given block may be implemented by more than one circuit component without departing from the scope of the present disclosure.

Figure 2:
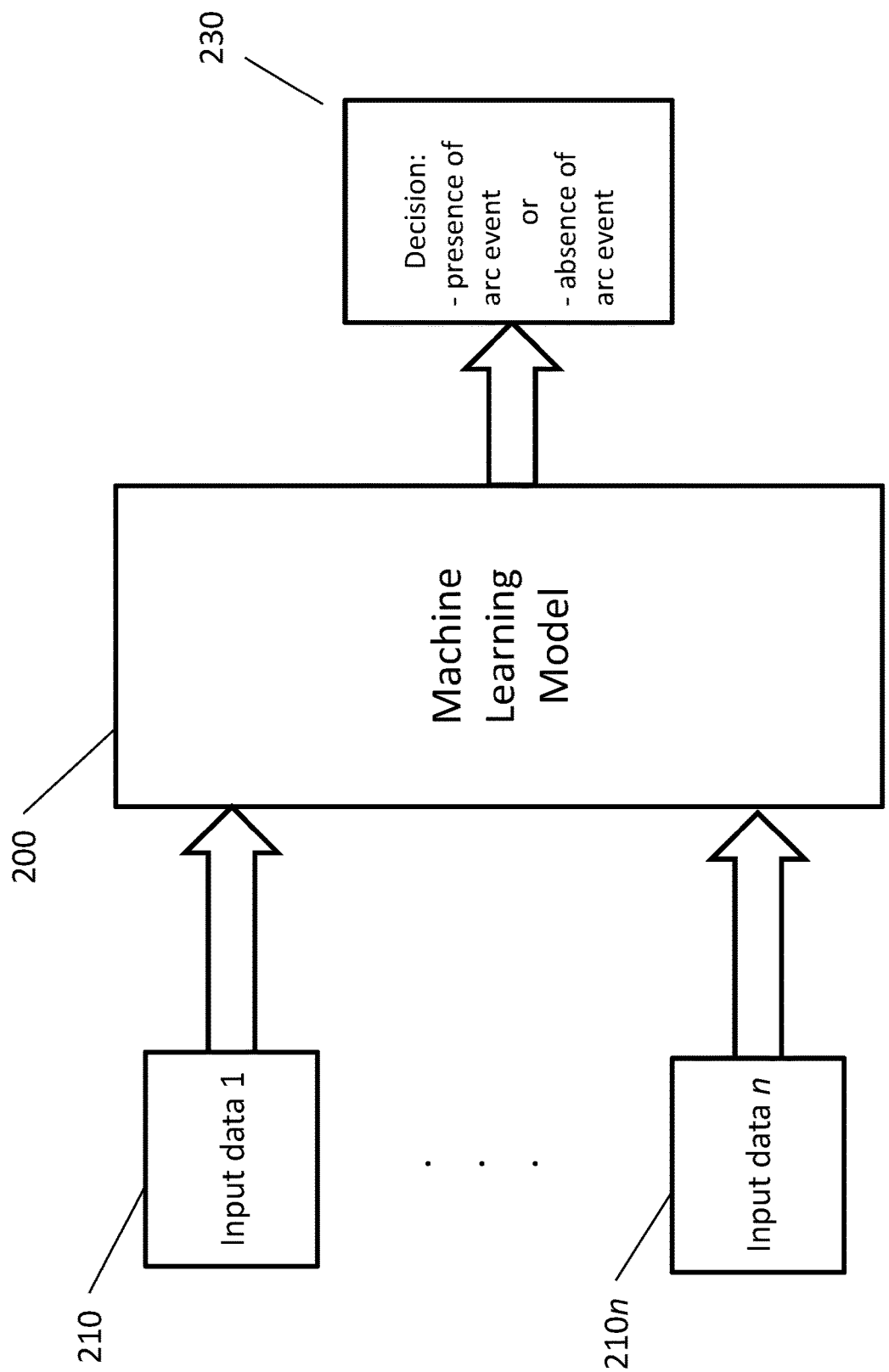
FIG. 2 is a diagram of an exemplary machine learning model implemented by an electrical switch apparatus, in accordance with aspects of the present disclosure.

Referring now to FIG. 2, there is shown a diagram of a machine learning model implemented by an electrical switch apparatus, such as the AFCI device or system of FIG. 1. The machine learning model may be implemented by, for example, the microprocessor 100 of FIG. 1. As used herein, a machine learning model refers to and includes a system which receives input data and performs machine learning computations based on the input data to decide which of two or more categories (e.g., presence of an arc event or absence of an arc event) apply the input data. Certain types of machine learning models provide classification scores and/or classification probabilities to in the process of making its decision. As used herein, the term "classification score" refers to and includes a value which indicates the extent to which a category is applicable to the input data. The term "classification probability" refers to classification scores which indicate a probability that a category is applicable to the input data, where the probabilities across all categories total to one hundred percent (e.g., unity, 100%). For simplicity, the following description may refer to classification scores, but it is intended that any description involving classification scores will apply to classification probabilities as well. In accordance with aspects of the present disclosure, certain machine learning models may not use classification scores or classification probabilities.

In the illustrated embodiment of FIG. 2, the machine learning model 200 receives a number n of input data 210-201n. The input data 210-210n will be described in more detail below. The machine learning model 200 may be or may use, for example, a decision tree, k-nearest neighbor, neural network, random forest, support vector machine (SVM), logistic regression or another type of regression, Bayesian model, clustering, or deep learning, among other types of machine learning models. Persons skilled in the art will understand how to implement such machine learning models.

In the illustrated embodiment, the machine learning model 200 provides a decision 230 about whether the input data 210-210n indicates presents of an arc event or absence of an arc event. In various embodiments, the decision 230 may be based on two classification scores generated within the machine learning model 200, including a classification score that an arc event occurred and a classification score or probability that an arc event did not occur. With reference to the AFCI device 5 of FIG. 1, and in various embodiments, the microprocessor 100 can trigger the controllably conductive switch 60 if the classification score that an arc event occurred is greater than the classification score that an arc event did not occur. Otherwise, the microprocessor 100 would not trigger the controllably conductive switch 60.

The illustrated embodiment of FIG. 2 is exemplary, and variations are contemplated to be within the scope of the present disclosure. For example, in various embodiments, the machine learning model may use more than two classification scores or probabilities to make a decision. In various embodiments, the machine learning model may not operate based on input data and may operate based on deep learning techniques using signal samples as inputs. For example, signal samples/measurements from one or more sensors may be directly used as inputs to a deep learning neural network, which may be trained to decide whether the signal samples/measures indicate presence of an arc event or absence of an arc event. In various embodiments, more than one machine learning model may be implemented and the resulting decisions, classification scores, and/or probabilities provided by the multiple machine learning models may be combined in various ways. Such variations and other variations are contemplated to be within the scope of the present disclosure.

Figure 3:
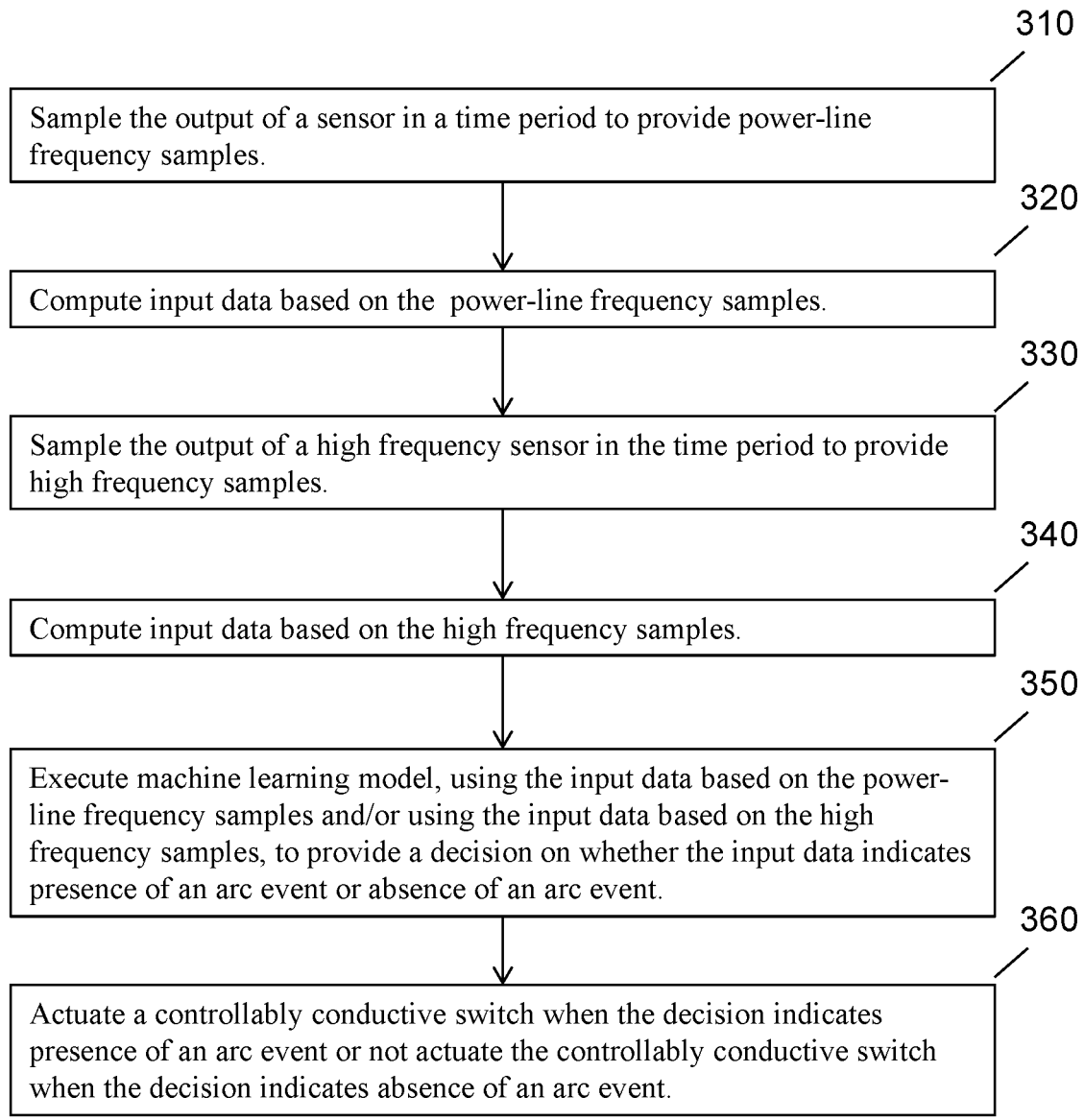
FIG. 3 is a diagram of an exemplary process for operating an AFCI device or system, in accordance with aspects of the present disclosure.

Referring now to FIG. 3, there is shown an exemplary process for operating an AFCI device or system. The operations can be performed by, for example, the microprocessor 100 of an AFCI device or system 5 (FIG. 1). At block 310, the operation involves sampling the output of a power-line frequency/current sensor, such as current sensor 24 of FIG. 1, in a time period to provide power-line frequency samples. In various embodiments, the time period may be one half-cycle of a power-line frequency, such as one half-cycle of 60 Hz. The time period (e.g., one half-cycle) does not need to align with a zero-crossing of the power-line signal but may do so. When the time period does not align with a zero-crossing of the power-line signal, the samples may correspond to any portion of the power-line signal. At block 320, the operation involves computing input data based on the power-line frequency samples (e.g., current samples). At block 330, the operation involves sampling the output of a high frequency sensor, such as sensor 22 of FIG. 1, in the time period to provide high frequency samples. At block 340, the operation involves computing input data based on the high frequency samples. At block 350, the operation involves executing the machine learning model, using the input features based on the power-line frequency samples and/or using the input features based on the high frequency samples, to provide a decision on whether the input data indicates presence of an arc event or absence of an arc event. At block 360, the operation involves actuating a controllably conductive switch when the decision indicates presence of an arc event or not actuating the controllably conductive switch when the decision indicates absence of an arc event.

The operation of FIG. 3 is exemplary, and variations are contemplated to be within the scope of the present disclosure. For example, in various embodiments, blocks 310 and 320 may be optional, such that no input data based on power-line frequency samples are computed by the operation. In various embodiments, blocks 330 and 340 may be optional, such that no input data based on high frequency samples are computed by the operation. In various embodiments, only one input data may be computed at block 320. In various embodiments, only one input data may be computed at block 340. Such variations and other variations are contemplated to be within the scope of the present disclosure.

Figure 4:
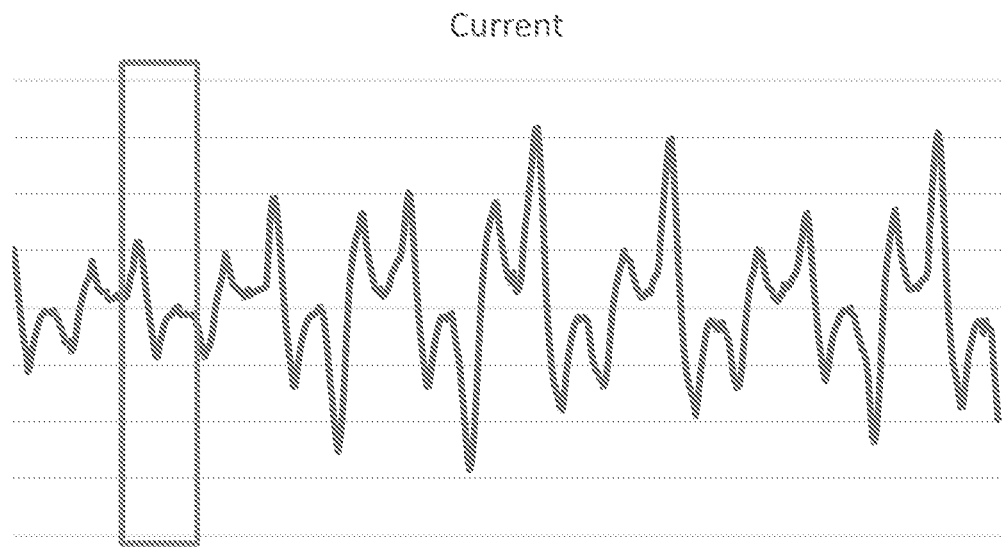
FIG. 4 is a graph of exemplary current samples, in accordance with aspects of the present disclosure.

FIG. 4 shows an example of samples of a power-line frequency/current sensor, such as current sensor 24 of FIG. 1, over several cycles of the current signal. The box of FIG. 4 indicates one half-cycle of the power-line frequency (e.g., the power line frequency being 60 Hz) for use as a sampling window. As mentioned above, the one half-cycle/sampling window does not need to align with a zero-crossing of the power-line signal but may do so. When the sampling window does not align with a zero-crossing of the power-line signal, the samples may correspond to any portion of the power-line signal. In various embodiments, approximately thirty-two samples can be obtained in a sampling window. In various embodiments, another sampling rate can be used to obtain another number of samples. In various embodiments, the current samples for a time period of one half-cycle can be used to compute input data based on the current samples. In various embodiment, a time period different from one half-cycle can be used, and current samples over such a time period/sampling window can be used to compute input data based on the current samples.

In accordance with aspects of the present disclosure, the input data based on the current samples over a time period, such as a one half-cycle sampling window, can include the mean of the current samples within the time period and/or the maximum difference between two consecutive current samples within the time period. Other input data based on the current samples can be computed and are contemplated to be within the scope of the present disclosure. In various embodiments, the machine learning model may use one input data based on the current samples, multiple input data based on the current samples, or no input data based on the current samples. Such variations are contemplated to be within the scope of the present disclosure.

Figure 5:
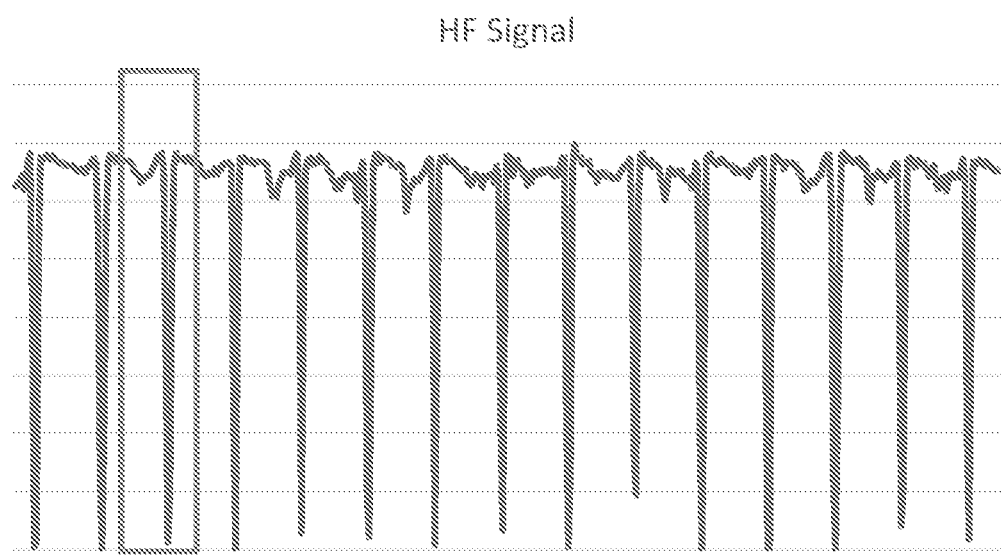
FIG. 5 is a graph of exemplary high frequency samples, in accordance with aspects of the present disclosure.

FIG. 5 shows an example of samples of a high frequency sensor, such as high frequency sensor 22 of FIG. 1, over several cycles of a power-line frequency signal. The box of FIG. 5 indicates one half-cycle of the power-line frequency (e.g., the power line frequency being 60 Hz) for use as a sampling window. As mentioned above, the one half-cycle/sampling window does not need to align with a zero-crossing of the power-line signal but may do so. In the illustrated embodiment, approximately thirty-two samples can be obtained in the sampling window. In various embodiments, another sampling rate can be used to obtain another number of samples. In various embodiments, the high frequency samples for a time period of one half-cycle can be used to compute input data based on the high frequency samples. In various embodiment, a time period different from one half-cycle can be used, and high frequency samples over such a time period can be used to compute input data based on the high frequency samples.

In accordance with aspects of the present disclosure, the input features based on the high frequency samples over a time period, such as but not limited to one half-cycle of a power-line frequency, can include one or more of input features shown in Table 1.

TABLE 1

Input Features Based on High Frequency Samples

| Input Feature | Computation |
|---|---|
| Average ($F\_av$) | Average of the high frequency samples. |
| Close to low count | A number of the high frequency samples in a first low measurement range when an average of the high frequency samples is in a first range, or a number of the high frequency component samples in a second low measurement range when the average of the high frequency component samples is in a second range.<br>The second range may be lower than the first range. An end point of the first range and an end point of the second range may be the same.<br>The first low measurement range and the second low measurement range may both be below the second range. A portion of the first low measurement range may be higher than the second low measurement range. An end point of the first low measurement range and an end point of the second low measurement range may be the same.<br>Example: within one half-cycle, when $F\_av > 900$, the count of high frequency samples with value below 250; or when $400 < F\_av < 900$, the count of high frequency samples with value below 150. |
| Close to high count | A number of the high frequency samples in a first high measurement range when the average of the high frequency samples is in a first range, or a number of the high frequency samples in a second high measurement range when the average of the high frequency component samples is in a second range.<br>The second range may be lower than the first range. An end point of the first range and an end point of the second range may be the same.<br>The first high measurement range may be above a portion of the first range. At least a portion of the second high measurement range may be below the first high measurement range. An end point of the first high measurement range and an end point of the second high measurement range may be the same. An end point of the first high measurement range may be the lower of $F\_av$ or a predetermined end point value. An end point of the second high measurement range may be within the second range.<br>Example: within one half-cycle, when $F\_av > 900$, the count of high frequency samples with value larger than $F\_av$, above 1000 and below 2300; or when $400 < F\_av < 900$, the count of high frequency samples with the value below 2300 and above 600. |
| Maximum frequency sample | Maximum value of high frequency samples. |
| Minimum frequency sample | Minimum value of high frequency samples. |
| First high count | A number of the high frequency samples in a high measurement range.<br>The high measurement range may be all values above a predetermined threshold.<br>Example: count of high frequency samples with value above 1100 within one half-cycle. |
| Second high count | A number of the high frequency samples in a high measurement range.<br>The high measurement range may be all values above a predetermined threshold.<br>Example: count of high frequency samples with value above 1300 within one half-cycle. |
| Maximum increase | Maximum increase between consecutive samples of the high frequency samples.<br>Maximum increase may be always a positive number. |
| Maximum decrease | Maximum decrease between consecutive samples of the high frequency samples.<br>Maximum decrease may be always a negative number. |

TABLE 1-continued

Input Features Based on High Frequency Samples

| Input Feature | Computation |
| --- | --- |
| Distance between max increase and max decrease | Index difference between an index corresponding to the maximum increase between consecutive samples of the high frequency samples and an index corresponding to a maximum decrease between consecutive samples of the high frequency samples. |
| Low count | A number of the high frequency samples in a low measurement range.<br>The low measurement range may be all values below a predetermined threshold.<br>Example: count of high frequency measurements with the value below 100 within one half cycle. |

Other input data based on the high frequency samples can be computed and are contemplated to be within the scope of the present disclosure. In various embodiments, the machine learning model may use one input data based on the high frequency samples, multiple input data based on the high frequency samples, or no input data based on the high frequency samples. Such variations are contemplated to be within the scope of the present disclosure.

Accordingly, described above are AFCI systems and devices which apply a machine learning model and uses input data based on current samples and/or input data based on high frequency samples to decide whether an arc event has occurred. Persons skilled in the art will understand how to train and implement various machine learning models based on one or more of the input data described in connection with FIG. 4 and FIG. 5. As persons skilled in the art will understand, when supervised learning is implemented, input data corresponding to an arc fault are labeled as such, and input data corresponding to no arc fault are labeled as such. In various embodiments, labeling for supervised learning can be performed by persons knowledgeable in identifying arc faults, by AFCI devices which are configured to detect arc faults, and/or by computational systems which are configured to detect arc faults. When unsupervised learning is implemented, such as clustering, input data do not need to be labeled. Persons skilled in the art will understand other types of machine learning implementations, which are all intended to be within the scope of the present disclosure.

Figure 6:
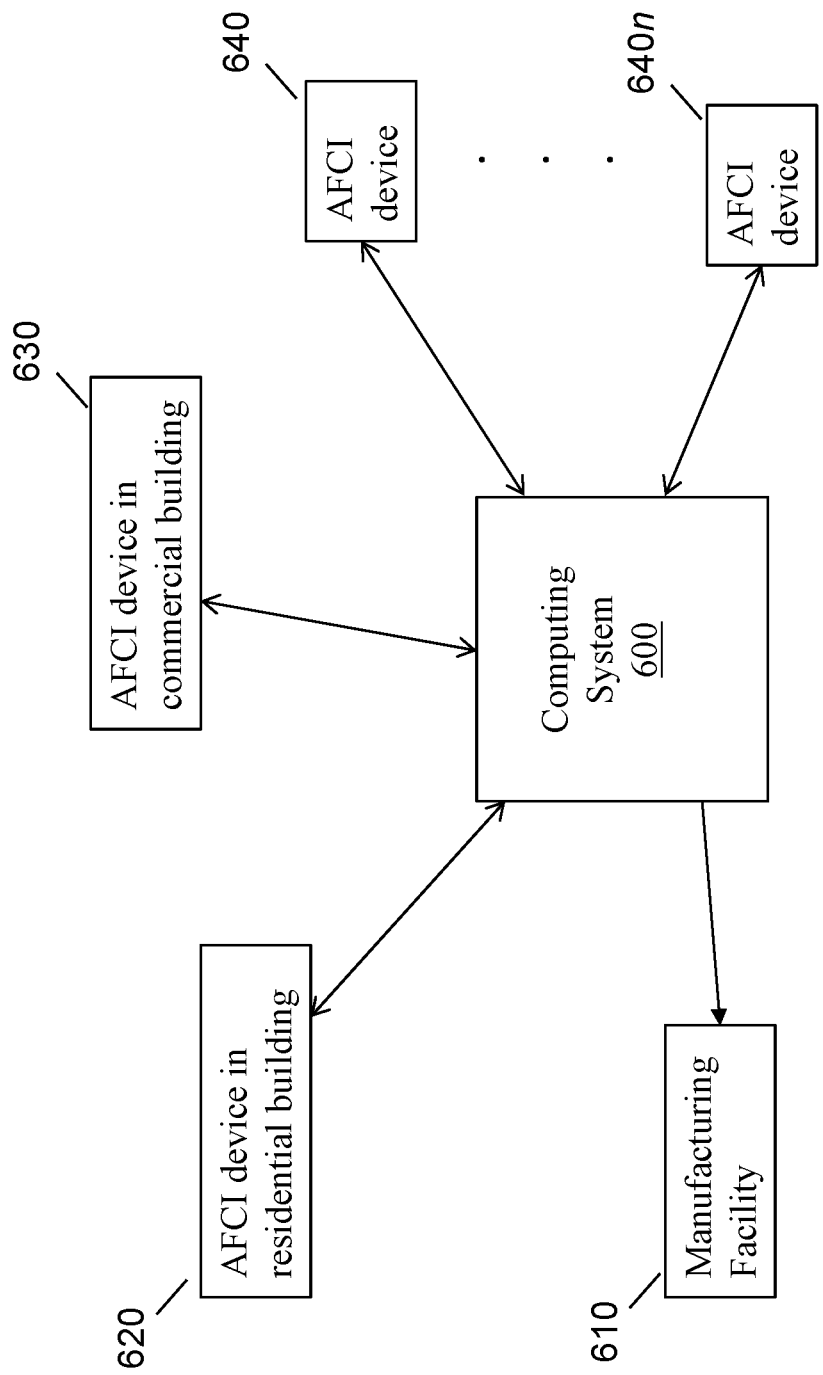
FIG. 6 is a diagram of an exemplary system for training and deploying machine learning models, in accordance with aspects of the present disclosure.

FIG. 6 is a diagram of an exemplary system for training and deploying machine learning models to arc fault detection devices for deciding whether an arc event is present or absent. A computing system 600 can implement and train a machine learning model. The computing system 600 may be a cloud system or may be a non-cloud system, such as a proprietary computing system. In various embodiments, the computing system 600 may be a desktop computer, a laptop, a tablet, or a smartphone, among other things. The computing system 600 can include components which persons skilled in the art will recognize, such as processors (e.g., CPUs, GPUs, etc.), memory (e.g., RAM), storage devices, and communication devices. All such components and other components which persons skilled in the art would recognize are contemplated to be within the scope of the present disclosure.

The computing system 600 may receive training data that includes training data corresponding to presence of arc faults and training data corresponding to absence of arc faults. The training data can include one or more of the input data described in connection with FIG. 4 and FIG. 5. In accordance with aspects of the present disclosure, the computing system 600 can implement and train a decision tree using the input data described in connection with FIG. 4 and FIG. 5 and using classification and regression tree (CART) analysis. It has been found that a trained decision tree can detect serial arc faults at about 92% true positive rate. A decision tree implementation for arc fault detection is described in more detail in connection with FIG. 8.

In accordance with aspects of the present disclosure, the computing system 600 can train a machine learning model and deploy the trained machine learning model to remote AFCI devices, such as AFCI devices which are installed and operational in residential building 620, AFCI devices which are installed and operational in commercial buildings 630, and/or other AFCI devices 640-640n. As mentioned above herein, the computing system 600 is a remote from the AFCI devices 640-640n in that the computing system 600 is not physically part of any of the AFCI devices 640-640n. The AFCI devices 620-640n can be communication-enabled AFCI devices, such as an AFCI device having communication circuitry 107, as shown in FIG. 1. The communication circuitry 107 can enable, for example, Wi-Fi communications, Bluetooth communications, or other communication protocols. Various aspects of communication-enabled AFCI devices and various aspects of updating AFCI devices are described in U.S. Patent Application Publication No. 2020/0059081 and No. 2020/0051423, which are hereby incorporated by reference herein in their entirety. Aspects of deploying a trained machine learning model to an AFCI device will be described in connection with FIG. 7.

In various embodiments, the AFCI devices 620-640n can communicate sensor data/measurements to the computing system 600 for the computing system 600 to use as further training data. The communications can occur over one or more networks (e.g., intranet, extranet, Internet, cellular network, etc.) and may occur through one or more intermediate devices (e.g., routers, switches, etc.) The networks and intermediate devices (if any) are not illustrated in FIG. 6 for simplicity. In various embodiments, the AFCI devices 620-640n can compute the input data used by the machine learning models, such as the input data described in connection with FIG. 4 and FIG. 5, and can then communicate the input data to the computing system 600 for use as further training data. In various embodiments, the AFCI devices 620-640n can communicate a combination of sensor data/measurements and computed input data to the computing system 600. In this manner, the computing system 600 can receive sensor data/measurements and/or input data from AFCI devices operating in real-world situations and can update and train machine learning models using such data.

In accordance with aspects of the present disclosure, the computing system 600 can convey an arc detection program, which implements a trained machine learning model and which includes instructions for computing input data for input to the machine learning model, to a manufacturing facility 610 which manufacturers AFCI devices, such as the AFCI device of FIG. 1. In various embodiments, the manufacturing facility 610 can deploy the arc detection program in the AFCI devices as firmware.

In accordance with aspects of the present disclosure, the AFCI devices 620-640n can be manufactured to contain an arc detection program which implements a trained machine learning model in accordance with aspects of the present disclosure. Over time, the computing system 600 may improve the accuracy of the machine learning model by further training, such as reducing false positive arc event decision. In accordance with aspects of the present disclosure, the AFCI devices 620-640n can be manufactured to contain a trained machine learning model in accordance with aspects of the present disclosure. Over time, the computing system 600 may improve the accuracy of the machine learning model by further training. The computing system 600 can be configured to communicate an updated machine learning model, or data thereof, to the communication circuitry of the installed AFCI devices, and the microprocessors of the AFCI devices can update the detection programs in the AFCI devices.

In accordance with aspects of the present disclosure, the computing system 600 may train different machine learning models for different AFCI devices. For example, the AFCI devices in the residential building 620 may experience different conditions than the AFCI devices in the commercial building 630. The computing system 600 may train a particular machine learning model for the AFCI devices in the residential building 620 and may train a different machine learning model for the AFCI devices in the commercial building 630. In general, the computing system 600 may train a particular machine learning model for any particular group of AFCI devices.

In various embodiments, an AFCI device or a group of AFCI devices may experience "nuisance trips," which are false positive arc event decisions. In accordance with aspects of the present disclosure, such communication-enabled AFCI devices may communicate their sensor data and/or communicate their input data to the computing system 600 every time the AFCI trips. In various embodiments, the computing system 600 may process the received sensor data and/or input data to distinguish between data reflecting a true arc event and data reflecting a false positive arc event/nuisance trip. Techniques for such processing to distinguish data reflecting true arc event and data reflecting false positive arc event will be recognized by persons skilled in the art. In various embodiments, data analysts and/or engineers may process the received sensor data and/or input data to categorize the data as a true arc fault or a false positive arc event. The computing system may train a machine learning model based on such sensor data and/or input data to reduce false positive arc event decisions. The communications may occur using various aspects described in U.S. Patent Application Publication No. 2020/0059081 and No. 2020/0051423, which were incorporated by reference above. As persons skilled in the art will recognize, manually adjusting an arc detection program by engineers is time consuming. Training a machine learning model using sensor data/measurements representative of true arc events and nuisance trips can provide a quicker solution.

The aspects and embodiments described in connection with FIG. 6 are exemplary. Variations of the described aspects and embodiments are contemplated to be within the scope of the present disclosure. For example, in various embodiments, the AFCI devices may be configured to communicate sensor data or input data to the computing system 600 based on certain criteria. For example, the AFCI devices may be configured to communicate sensor data or input data to the computing system 600 when a user instructs the AFCI device to transmit the data, such as by pressing a button on the AFCI device, or engaging an interface of a connected smartphone app, or directing the transmission through a cloud interface, or by other ways. In various embodiments, an AFCI device may be configured to communicate sensor data or input data to the computing system 600 when the AFCI device detects a predetermined number of arc events followed by resets, which occur in a predetermined period of time (e.g., an AFCI trips and resets three times in a span of three minutes). In various embodiments, all sensor data/input data received by the computing system 600 may be designated as true arc data by default, and the computing system 600 or a data analyst/engineer may then re-categorize certain data as false positive arc event data. Such and other variations are contemplated to be within the scope of the present disclosure.

Figure 7:
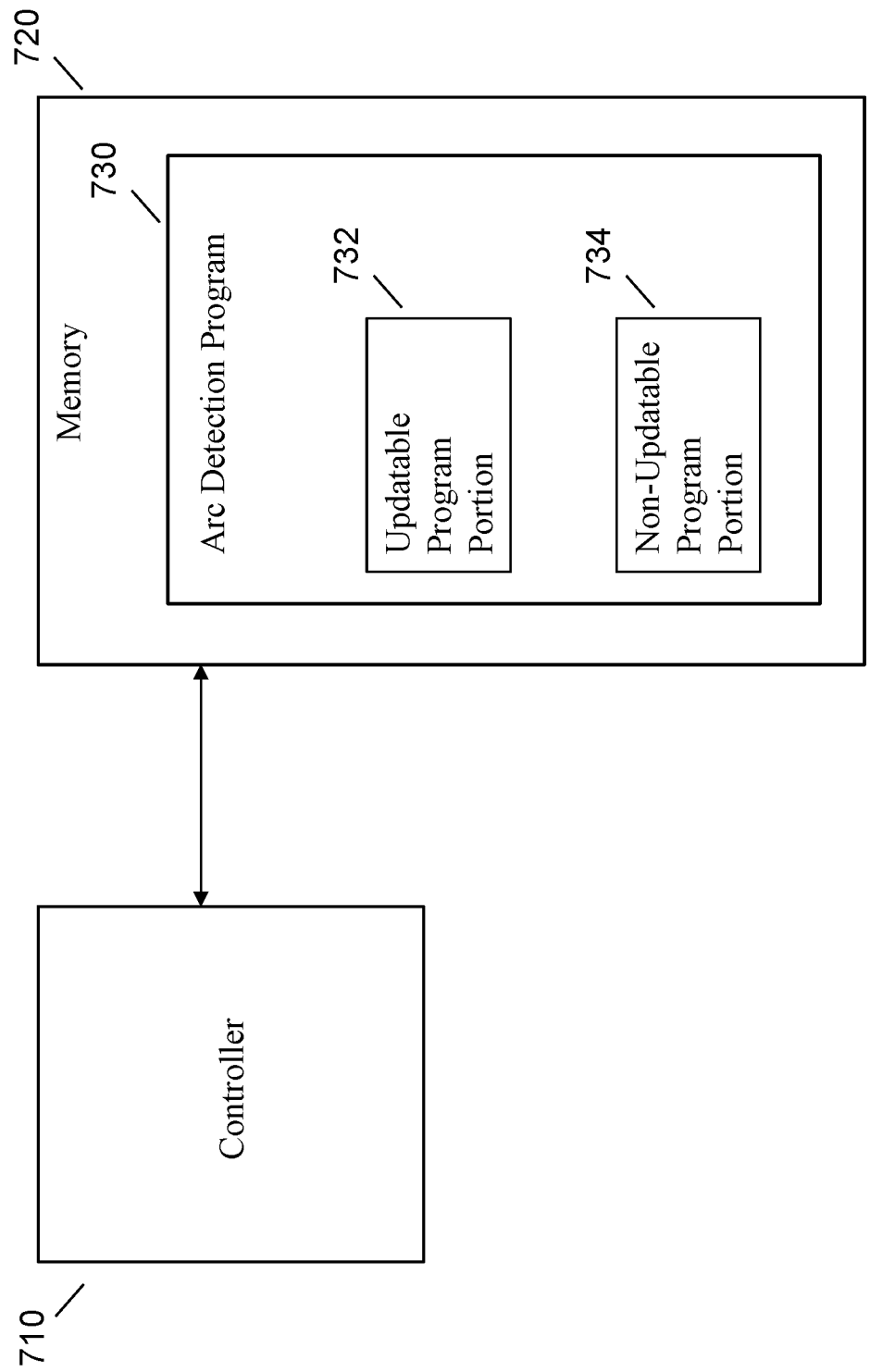
FIG. 7 is a diagram of exemplary components of an AFCI device which includes an arc detection program, in accordance with aspects of the present disclosure.

In accordance with aspects of the present disclosure, FIG. 7 shows a block diagram of exemplary components of an AFCI device, such as the AFCI device of FIG. 1. For clarity, only certain components are illustrated, and persons skilled in the art will recognize other components which may be present in an AFCI device, such as various components shown in FIG. 1. The exemplary components include a controller 710 and a memory 720. The controller 710 may be any processor or controller, such as those described above in connection with microprocessor 100 FIG. 1. The memory 720 may be any type of memory, such as random access memory or flash memory, among others. Although a single controller 710 and a single memory 720 are illustrated, embodiments having more than one controller and/or more than one memory are contemplated to be within the scope of the present disclosure.

The memory 720 is configured to store an arc detection program 730, which may be firmware and may include machine-readable and machine-executable instructions to be executed by the controller 710. The arc detection program 730 may implement a trained machine learning model for deciding between presence and absence of an arc event, such as the machine leaning models described in connection with FIG. 2, and may include instructions for computing input data for input to the machine learning model, such as the input data described in connection with FIG. 4 and/or FIG. 5. In various embodiments, the memory 720 may store the sensor measurements for computing the input data and/or may store the input data computed based on the sensor measurements.

In accordance with aspects of the present disclosure, the arc detection program 730 includes a field-updatable program portion 732 and a non-field-updatable program portion 734. The non-field-updatable program portion 734 may include instructions which implement a machine learning model and which do not change when the machine learning model is improved by a computing system (such as by the computing system 600 of FIG. 6). The field-updatable program portion 732 may include program parameters to be used by the non-field-updatable program portion 734 for deciding between presence of an arc event or absence of an arc event.

In various embodiments, the non-field-updatable program portion 734 may include memory pointers to the memory locations storing the field-updatable program portion 732. Updates to the field-updatable program portion 732 may be stored in the memory locations referenced by the memory pointers. The non-field-updatable program portion 734 may access the updates by accessing the same memory locations referenced by the memory pointers.

In various embodiments, the non-field-updatable program 734 portion may include machine instructions which implement computational operations, and the field-updatable program portion 732 may include variables and numerical values used by the computational operations. An example for implementing a decision tree is described in connection with FIG. 8.

In various embodiments, the non-field-updatable program portion 734 may be stored in read-only memory or in a protection portion of the memory 720. In various embodiments, the non-field-updatable program portion 734 may not be stored in protected memory. Rather, the non-field-updatable program portion 734 may not be field-updatable because the firmware update program for the AFCI device may not include instructions for updating the non-field-updatable program portion 734. Other ways of protecting or not updating the non-field-updatable program portion 734 are contemplated to be within the scope of the present disclosure.

Implementing a machine learning model using the illustrated embodiment is advantageous for ensuring that the capabilities of the controller 710 are adequate to implement the arc detection program 730 effectively, while still permitting the arc detection program 730 to be updated to some degree to improve accuracy and reduce false positive decisions.

Figure 8:
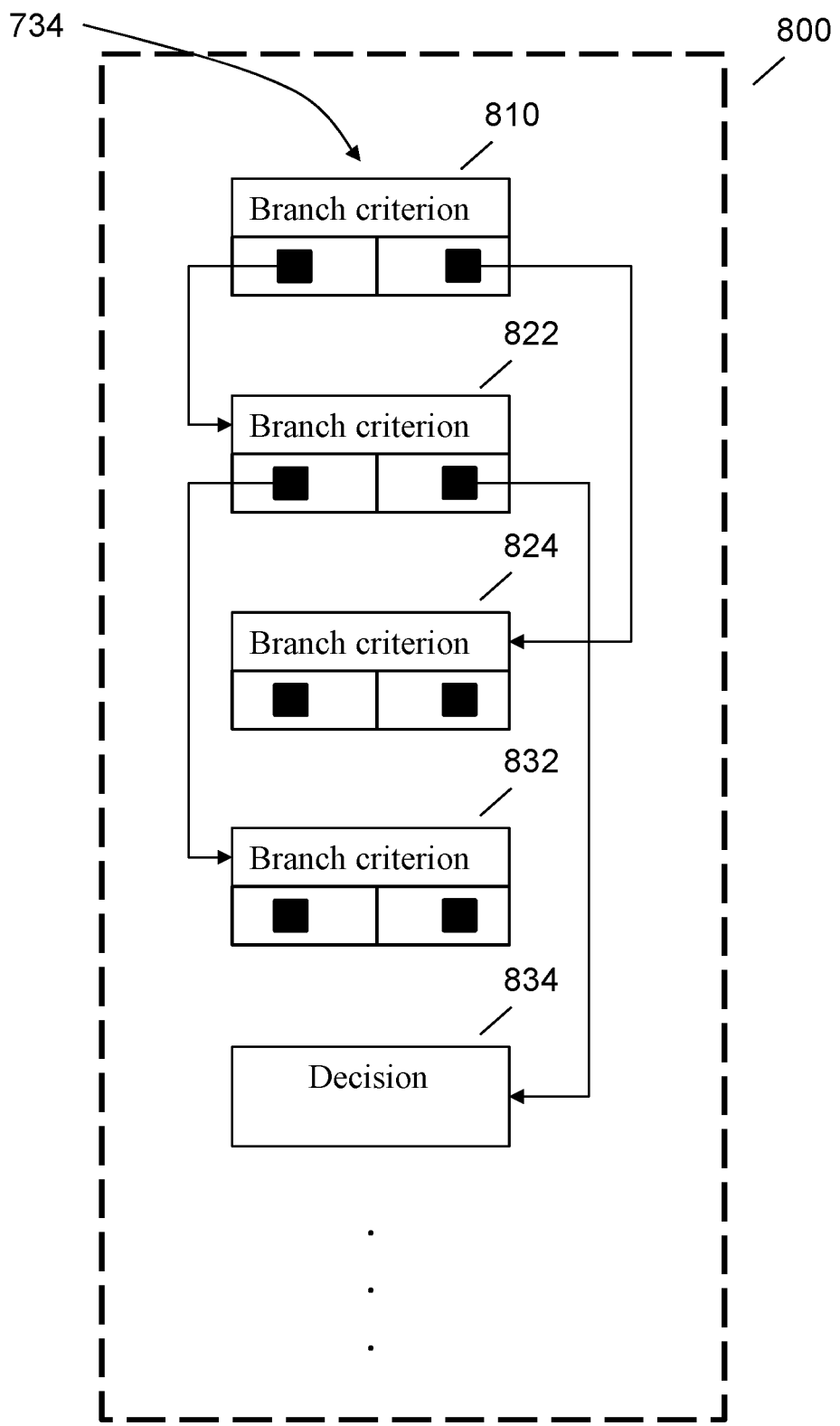
FIG. 8 is a diagram of exemplary decision tree parameters in a memory, in accordance with aspects of the present disclosure.
Figure 9:
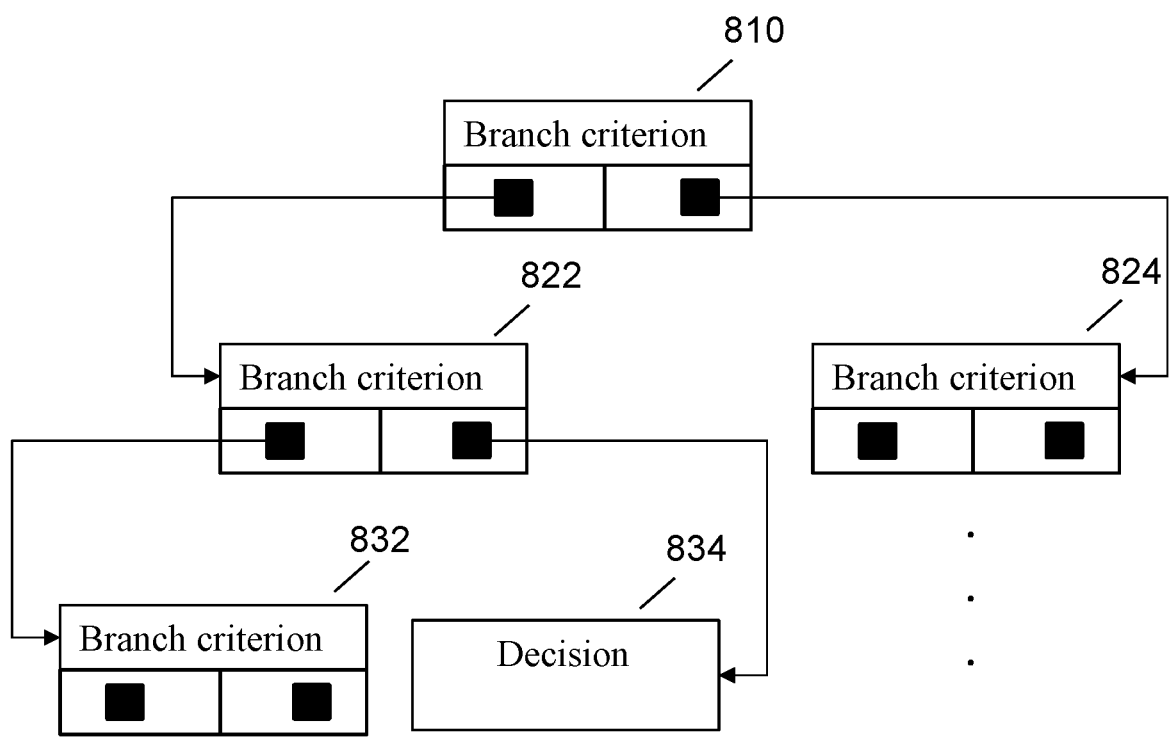
FIG. 9 is a diagram of the exemplary decision tree parameters of FIG. 8 shown in a decision tree arrangement, in accordance with aspects of the present disclosure.

FIG. 8 shows a diagram of an exemplary memory 800 which may store the field-updatable program portion of the arc detection program and which may be referenced by a memory pointer of the non-field-updatable program portion 734 of the arc detection program. The illustrated parameters implement an exemplary decision tree. As persons skilled in the art will understand, a decision tree includes nodes, and each node includes either a decision tree decision (e.g., presence of an arc event or absence of an arc event) or a branch criterion together with destination nodes. In FIG. 8, five nodes 810-834 are illustrated, in which four nodes 810-832 include a branch criterion and destination nodes, and one node 834 includes a decision tree decision. FIG. 9 shows the same five nodes 810-834 presented in the arrangement that decision trees are typically viewed and understood. As shown by FIG. 9, a node which includes a branch criterion and destination nodes will branch off to further nodes, whereas a node which includes a decision tree decision does not branch off to any other nodes.

In a decision tree, the node operation for each node is the same and does not change. As such, the node operation may be implemented by the non-field-updatable program portion 734 of the arc detection program. For example, the node operation for each node may be as follows: (1) if the node includes a decision, provide the decision; (2) if the node includes a branch criterion, evaluate the branch criterion to select one of the destination nodes; (3) repeat the node operation for the selected node destination. Starting with the initial node 810, the node operation determines that the node 810 does not include a decision. Rather, the node 810 includes a branch criterion and destination nodes. Accordingly, the node operation evaluates the branch criterion to select one of the destination nodes 822 or 824. If the result of the branch criterion selects destination node 822, the node operation repeats for the destination node 822. If the result of the branch criterion selects destination node 824, the node operation repeats for the destination node 824.

If destination node 822 is selected, the node operation is performed for node 822. The node operation determines that node 822 does not include a decision. Rather, the node 822 includes a branch criterion and destination nodes. Accordingly, the node operation evaluates the branch criterion to select one of the destination nodes 832 or 834. If the result of the branch criterion selects destination node 832, the node operation repeats for the destination node 832. If the result of the branch criterion selects destination node 834, the node operation repeats for the destination node 834.

If destination node 834 is selected, the node operation is performed for node 834. The node operation determines that node 834 does include a decision (e.g., presence of an arc event, or absence of an arc event). Accordingly, the node operation provides the decision of node 834 as the resulting decision of the decision tree.

As shown by the exemplary decision tree of FIGS. 8 and 9, the node operation is the same regardless of how the decision tree is configured. Thus, the node operation may form the non-field-updatable program portion of the arc detection program. In various embodiments, the node operation may include various types of predetermined operators (e.g., greater than, less than, equal to, not equal to, greater than or equal to, less than or equal to, etc.). The branch criterion may specify one or more operators to use and may specify the operands for the operator(s). The operands may include the input data described above in connection with FIGS. 4 and 5 and may include numerical values. As an example, and referring to Table 1 and FIG. 9, the branch criterion of node 810 may be:

(Maximum increase between consecutive samples of the high frequency samples)<10.

The operator of the branch criterion is a "less than" operator. The operands are one of the input data (maximum increase between consecutive samples of the high frequency samples) and a numerical value (10). The input data for the operand may be computed based on sensor measurements. Thus, the branch criteria can specify operators and operands. For node 810, if the criterion is true, the destination node 822 may be selected, and if the criterion is false, the destination node 824 may be selected.

The nodes shown in FIGS. 8 and 9 are exemplary, and variations are contemplated to be within the scope of the present disclosure. For example, node operations other than those described above are contemplated to be within the scope of the present disclosure. Additionally, other ways of separating an arc detection program into a field-updatable program portion and a non-field-updatable program portion are contemplated to be within the scope of the present disclosure.

Referring again to FIG. 7, the arc detection program 730 may implement other machine learning models using the same approach. For example, as persons skilled in the art will recognize, neural networks have nodes and certain neural networks may be implemented using the same node operations for each node. Accordingly, the non-field-updatable program portion 734 may implement node operations for a neural network, and the field-updatable program portion 732 may include parameters to be used by the node operations. The same approach may be used for other types of machine learning models as well.

Various benefits of the approach of FIG. 7 were described above. Additionally, updating only "parameters" of a machine learning model without updating the code/operations of the machine learning model may permit the field-deployed AFCI devices to be updated without needing recertification, such as UL recertification. In various embodiments, the AFCI devices may include a default factory-installed set of parameters, which may be used in the event remotely updated parameters become corrupted or otherwise unusable. The arc detection program 730 and/or a separate safety program (not shown) may occasionally perform tests to confirm the integrity and usability of the updated parameters. If such tests fail, the arc detection program 730 may then use the default factory-installed set of parameters.

Figure 10:
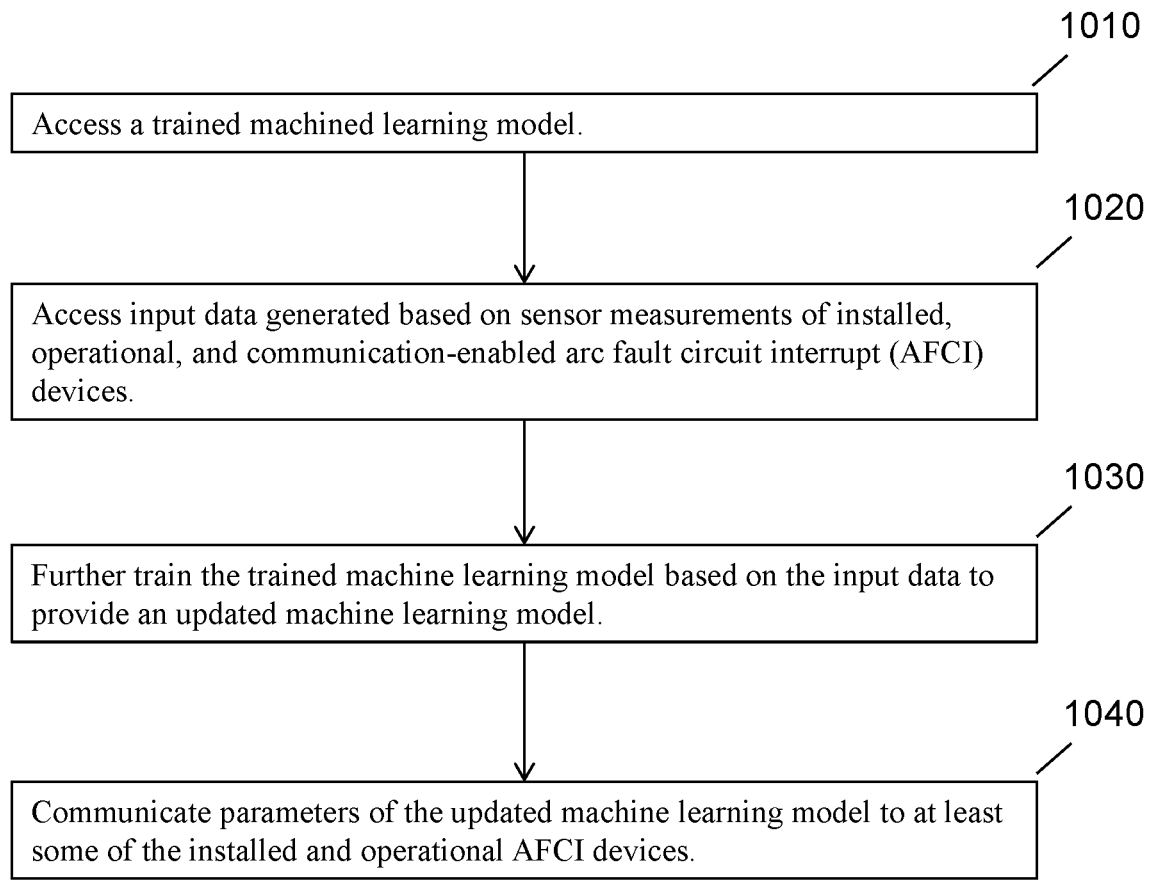
FIG. 10 shows an exemplary operation for training and deploying a machine learning model, in accordance with aspects of the present disclosure.

FIG. 10 shows an exemplary operation for improving a machine learning model and deploying updated parameters of the improved machine learning model to AFCI devices. The illustrated operation can be performed by, for example, the computing system 600 of FIG. 6. At block 1010, the operation involves accessing a trained machined learning model. At block 1020, the operation involves accessing input data generated based on sensor data/measurements of installed, operational, and communication-enabled arc fault circuit interrupt (AFCI) devices, such as those shown in FIG. 6. In various embodiments, the input data can be generated by the AFCI devices. In various embodiments, the AFCI devices can communicate sensor data/measurements to a computing system, and the computing system can generate the input data based on the sensor data/measurements. At block 1030, the operation involves further training the trained machine learning model based on the input data to provide an updated machine learning model. The updated machine learning model may include, for example, parameters which are different from the parameters of the previously trained machined learning model. At block 1040, the operation involves communicating parameters of the updated machine learning model to at least some of the installed and operational AFCI devices to replace the field-updatable program portions of the arc detection programs. In this manner, a process is disclosed for gathering real-world AFCI data for further training and improving trained machine learning models, and for providing parameters of an updated machine learning model to the installed AFCI devices. The illustrated embodiment of FIG. 10 is exemplary, and variations are contemplated to be within the scope of the present disclosure.

The embodiments disclosed herein are examples of the disclosure and may be embodied in various forms. For instance, although certain embodiments herein are described as separate embodiments, each of the embodiments herein may be combined with one or more of the other embodiments herein. Specific structural and functional details disclosed herein are not to be interpreted as limiting, but as a basis for the claims and as a representative basis for teaching one skilled in the art to variously employ the present disclosure in virtually any appropriately detailed structure. Like reference numerals may refer to similar or identical elements throughout the description of the figures.

The phrases "in an embodiment," "in embodiments," "in various embodiments," "in some embodiments," or "in other embodiments" may each refer to one or more of the same or different embodiments in accordance with the present disclosure. A phrase in the form "A or B" means "(A), (B), or (A and B)." A phrase in the form "at least one of A, B, or C" means "(A); (B); (C); (A and B); (A and C); (B and C); or (A, B, and C)."

Any of the herein described methods, programs, algorithms, or codes may be converted to, or expressed in, a programming language or computer program. The terms "programming language" and "computer program," as used herein, each include any language used to specify instructions to a computer, processor, or controller, and include (but is not limited to) the following languages and their derivatives: Assembler, Basic, Batch files, BCPL, C, C+, C++, Delphi, Fortran, Java, JavaScript, machine code, operating system command languages, Pascal, Perl, PL1, scripting languages, Visual Basic, metalanguages which themselves specify programs, and all first, second, third, fourth, fifth, or further generation computer languages. Also included are database and other data schemas, parameters and/or variables, and any other meta-languages. No distinction is made between languages which are interpreted, compiled, or use both compiled and interpreted approaches. No distinction is made between compiled and source versions of a program. Thus, reference to a program, where the programming language could exist in more than one state (such as source, compiled, object, or linked) is a reference to any and all such states. Reference to a program may encompass the actual instructions, variables, and parameters, and/or the intent of those instructions, variables, and parameters.

The systems described herein may also utilize one or more controllers to receive various information and transform the received information to generate an output. The controller may include any type of computing device, computational circuit, or any type of processor or processing circuit capable of executing a series of instructions that are stored in a memory. The controller may include multiple processors and/or multicore central processing units (CPUs) and may include any type of processor, such as a microprocessor, digital signal processor, microcontroller, programmable logic device (PLD), field programmable gate array (FPGA), or the like. The controller may also include a memory to store data and/or instructions that, when executed by the one or more processors, causes the one or more processors to perform one or more methods and/or algorithms.

It should be understood that the foregoing description is only illustrative of the present disclosure. Various alternatives and modifications can be devised by those skilled in the art without departing from the disclosure. Accordingly, the present disclosure is intended to embrace all such alternatives, modifications, and variations. The embodiments described with reference to the attached drawing figures are presented only to demonstrate certain examples of the disclosure. Other elements, steps, methods, and techniques that are insubstantially different from those described above and/or in the appended claims are also intended to be within the scope of the disclosure.

What is claimed is:

1. A circuit interrupter comprising:
   a housing configured to be installed in at least one of an electrical wall box or a load center;
   a conductive path;
   a switch configured to selectively interrupt the conductive path;
   a sensor in electrical communication with the conductive path and configured to measure an electrical characteristic of the conductive path, the sensor configured to provide a plurality of sensor measurements;
   a memory having an arc detection program stored therein, the arc detection program implementing a machine learning model, the arc detection program including a field-updatable program portion configured to be field-updatable and a non-field-updatable program portion, the field-updatable program portion including a plurality of machine learning model parameters, wherein the non-field-updatable program portion is configured to use the plurality of machine learning model parameters to decide between presence of an arc event or absence of an arc event; and a controller positioned within the housing and coupled to the memory, wherein the arc detection program, when executed by the controller, causes the controller to perform an operation comprising:

computing input data for the machine learning model based on the plurality of sensor measurements, providing a decision between presence of an arc event or absence of an arc event, the decision based on the input data, and causing the switch to interrupt the conductive path when the decision indicates presence of an arc event.

2. The circuit interrupter of claim 1, further comprising a communication device, wherein the controller is further configured to cause the communication device to communicate, with a remote device, at least one of: the plurality of sensor measurements or the input data computed based on the plurality of sensor measurements.

3. The circuit interrupter of claim 2, further comprising a user-accessible actuator, wherein the controller is configured to cause the communication device to communicate with the remote device when the user-accessible actuator is actuated.

4. The circuit interrupter of claim 2, wherein the memory is further configured to store a firmware update program which, when executed by the controller, causes the controller to perform a further operation comprising:

causing the communication device to receive an updated program portion having reduced false positive arc event decisions; and replacing the field-updatable program portion of the arc detection program with the updated program portion.

5. The circuit interrupter of claim 1, wherein the arc detection program implements a machine learning model having nodes, wherein the plurality of program parameters of the field-updatable program portion are node parameters of the nodes of the machine learning model, and wherein the non-field-updatable program portion is configured to perform node operations for the nodes of the machine learning model.

6. The circuit interrupter of claim 5, wherein the machine learning model is a decision tree, wherein the node parameters include, for each node of the decision tree, one of: a branch criterion and destination nodes, or a decision tree decision, and wherein the node operations comprise, for each node of the decision tree:

deciding whether the node parameters for the node include a decision tree decision or a branch criterion, in the case the node parameters for the node include of a decision tree decision, providing the decision tree decision, and in the case the node parameters for the node include a branch criterion and destination nodes, apply the branch criterion to the input data to select one of the destination nodes, and repeat the node operations for the selected destination node.

7. The circuit interrupter of claim 1, wherein the plurality of sensor measurements include high frequency component measurements relating to a high frequency characteristic of the conductive path, wherein the input data includes high frequency component input data computed based on the high frequency component measurements, the high frequency component input data including at least one of:

(i) a close to low count computed as: a number of the high frequency component measurements in a first low measurement range when an average of the high frequency component measurements is in a first range, or a number of the high frequency component measurements in a second low measurement range when the average of the high frequency component measurements is in a second range, (ii) a close to high count computed as: a number of the high frequency component measurements in a first high measurement range when the average of the high frequency component measurements is in the first range, or a number of the high frequency component measurements in a second high measurement range when the average of the high frequency component measurements is in the second range, (iii) an index difference between a first index corresponding to a maximum increase between consecutive measurements of the high frequency component measurements and a second index corresponding to a maximum decrease between consecutive measurements of the high frequency component measurements, (iv) a low count computed as a number of the high frequency component measurements in a third low measurement range, wherein the third low measurement range is below the second range, (v) a first high count computed as a number of the high frequency component measurements in a third high measurement range, or (vi) a second high count computed as a number of the high frequency component samples in a fourth high measurement range.

8. A method in a circuit interrupter having a conductive path, a switch configured to selectively interrupt the conductive path, and at least one sensor in electrical communication with the conductive path and configured to measure at least one electrical characteristic of the conductive path to provide a plurality of sensor measurements, the method comprising:

executing an arc detection program in the circuit interrupter, the arc detection program implementing a machine learning model and including a field-updatable program portion configured to be field-updatable and a non-field-updatable program portion, the field-updatable program portion including a plurality of machine learning model parameters to be used by the non-field-updatable program portion for deciding between presence of an arc event or absence of an arc event, wherein executing the arc detection program causes the circuit interrupter to perform an operation comprising:

computing input data for the machine learning model based on the plurality of sensor measurements, deciding between presence of an arc event or absence of an arc event, based on the input data, to provide a decision, and causing the switch to interrupt the conductive path when the decision indicates presence of an arc event.

9. The method of claim 8, further comprising communicating, with a remote device, at least one of: the plurality of sensor measurements or the input data computed based on the plurality of sensor measurements, when the decision indicating presence of an arc event corresponds to a false positive arc event decision.

10. The method of claim 9, further comprising:
receiving an updated program portion having reduced false positive arc event decisions; and
replacing the field-updatable program portion of the arc detection program with the updated program portion.

11. The method of claim 8, wherein the arc detection program implements a machine learning model having nodes,
wherein the plurality of program parameters of the field-updatable program portion are node parameters of the nodes of the machine learning model, and
wherein the non-field-updatable program portion is configured to perform node operations for the nodes of the machine learning model.

12. The method of claim 11, wherein the machine learning model is a decision tree,
wherein the node parameters include, for each node of the decision tree, one of: a branch criterion and destination nodes, or a decision tree decision, and
wherein the node operations comprise, for each node of the decision tree:
deciding whether the node parameters for the node include a decision tree decision or a branch criterion,
in the case the node parameters for the node include of a decision tree decision, providing the decision tree decision, and
in the case the node parameters for the node include a branch criterion and destination nodes, apply the branch criterion to the input data to select one of the destination nodes, and repeat the node operations for the selected destination node.

13. The method of claim 8, wherein the plurality of sensor measurements include high frequency component measurements relating to a high frequency characteristic of the conductive path,
wherein the input data includes high frequency component input data computed based on the high frequency component measurements, the high frequency component input data including at least one of:
(i) a close to low count computed as: a number of the high frequency component measurements in a first low measurement range when an average of the high frequency component measurements is in a first range, or a number of the high frequency component measurements in a second low measurement range when the average of the high frequency component measurements is in a second range,
(ii) a close to high count computed as: a number of the high frequency component measurements in a first high measurement range when the average of the high frequency component measurements is in the first range, or a number of the high frequency component measurements in a second high measurement range when the average of the high frequency component measurements is in the second range,
(iii) an index difference between a first index corresponding to a maximum increase between consecutive measurements of the high frequency component measurements and a second index corresponding to a maximum decrease between consecutive measurements of the high frequency component measurements,
(iv) a low count computed as a number of the high frequency component measurements in a third low measurement range, wherein the third low measurement range is below the second range,
(v) a first high count computed as a number of the high frequency component measurements in a third high measurement range, or
(vi) a second high count computed as a number of the high frequency component samples in a fourth high measurement range.

14. A processor-implemented method for updating installed arc fault circuit interrupt (AFCI) devices configured to execute an arc detection program implementing a machine learning model, the arc detection program including a field-updatable program portion configured to be field-updatable and a non-field-updatable program portion, the field-updatable program portion including a plurality of machine learning model parameters to be used by the non-field-updatable program portion for deciding between presence of an arc event or absence of an arc event, the method comprising:
receiving, from the installed AFCI devices, event data including at least one of: (i) a plurality of sensor measurements provided by sensors, in the installed AFCI devices, configured to measure at least one electrical characteristic of conductive paths in the AFCI devices, or (ii) input data for the machine learning model computed, in the installed AFCI devices, based on the plurality of sensor measurements;
preparing, based on the event data, an updated program portion having reduced false positive arc event decisions; and
communicating, to the installed AFCI devices, the updated program portion as a replacement for the field-updatable program portion of the arc detection program.

15. The processor-implemented method of claim 14, wherein preparing the updated program portion having reduced false positive arc event decisions includes:
in case the event data is the plurality of sensor measurements, computing the input data for the machine learning model based on the plurality of sensor measurements;
associating the input data with a label indicating absence of an arc event;
training an updated machine learning model using the input data and the label; and
providing parameters of the updated machine learning model as the updated program portion.

16. The processor-implemented method of claim 14, wherein the arc detection program implements a machine learning model having nodes,
wherein the plurality of program parameters of the field-updatable program portion are node parameters of the nodes of the machine learning model, and
wherein the non-field-updatable program portion is configured to perform node operations for the nodes of the machine learning model.

17. The processor-implemented method of claim 16, wherein the machine learning model is a decision tree,
wherein the node parameters include, for each node of the decision tree, one of: a branch criterion and destination nodes, or a decision tree decision, and wherein the node operations comprise, for each node of the decision tree:
  deciding whether the node parameters for the node include a decision tree decision or a branch criterion,
  in the case the node parameters for the node include of a decision tree decision, providing the decision tree decision, and
  in the case the node parameters for the node include a branch criterion and destination nodes, apply the branch criterion to the input data to select one of the destination nodes, and repeat the node operations for the selected destination node.

18. A system for updating installed arc fault circuit interrupt (AFCI) devices configured to execute an arc detection program implementing a machine learning model, the arc detection program including a field-updatable program portion configured to be field-updatable and a non-field-updatable program portion, the field-updatable program portion including a plurality of machine learning model parameters to be used by the non-field-updatable program portion for deciding between presence of an arc event or absence of an arc event, the system comprising:
  at least one processor; and
  one or more memory storing instructions which, when executed by the at least one processor, cause the system to perform an operation comprising:
    receiving, from the installed AFCI devices, event data including at least one of: (i) a plurality of sensor measurements provided by sensors, in the installed AFCI devices, configured to measure at least one electrical characteristic conductive paths in the AFCI devices, or (ii) input data for the machine learning model computed, in the installed AFCI devices, based on the plurality of sensor measurements;
    preparing, based on the event data, an updated program portion having reduced false positive arc event decisions; and
    communicating, to the installed AFCI devices, the updated program portion as a replacement for the field-updatable program portion of the arc detection program.

19. The system of claim 18, wherein in preparing the updated program portion having reduced false positive arc event decisions, the instructions, when executed by the at least one processor, cause the system to:
  in case the event data is the plurality of sensor measurements, compute the input data for the machine learning model based on the plurality of sensor measurements;
  associate the input data with a label indicating absence of an arc event;
  train an updated machine learning model using the input data and the label; and
  provide parameters of the updated machine learning model as the updated program portion.

20. The system of claim 18, wherein the arc detection program implements a machine learning model having nodes,
  wherein the plurality of program parameters of the field-updatable program portion are node parameters of the nodes of the machine learning model, and
  wherein the non-field-updatable program portion is configured to perform node operations for the nodes of the machine learning model.

21. The system of claim 20, wherein the machine learning model is a decision tree,
  wherein the node parameters include, for each node of the decision tree, one of: a branch criterion and destination nodes, or a decision tree decision, and
  wherein the node operations comprise, for each node of the decision tree:
    deciding whether the node parameters for the node include a decision tree decision or a branch criterion,
    in the case the node parameters for the node include of a decision tree decision, providing the decision tree decision, and
    in the case the node parameters for the node include a branch criterion and destination nodes, apply the branch criterion to the input data to select one of the destination nodes, and repeat the node operations for the selected destination node.

* * * * *